(12) United States Patent
Chan et al.

(10) Patent No.: US 7,295,046 B2
(45) Date of Patent: Nov. 13, 2007

(54) POWER DOWN DETECTION CIRCUIT

(75) Inventors: Johnny Chan, Fremont, CA (US);
Jeffrey Ming-Hung Tsai, San Jose, CA (US); Tin-Wai Wong, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/327,990

(22) Filed: Jan. 9, 2006

(65) Prior Publication Data
US 2007/0159217 A1  Jul. 12, 2007

(51) Int. Cl.
*H03K 5/22* (2006.01)
(52) U.S. Cl. .......................................... 327/77; 327/88
(58) Field of Classification Search .................. 327/77, 327/143, 88
See application file for complete search history.

(56) References Cited

U.S. PATENT DOCUMENTS

| | | | | |
|---|---|---|---|---|
| 4,831,595 A | | 5/1989 | Bone ........................... 365/229 |
| 5,027,006 A | * | 6/1991 | Queinnec et al. ............ 327/143 |
| 5,166,546 A | * | 11/1992 | Savignac et al. ............ 327/143 |
| 5,686,848 A | * | 11/1997 | Mes et al. .................... 327/143 |
| 5,778,238 A | | 7/1998 | Hofhine ........................ 327/143 |
| 6,313,693 B1 | | 11/2001 | Kelm ........................... 327/540 |
| 6,346,835 B1 | * | 2/2002 | Ozeki et al. ................. 327/143 |
| 6,597,215 B2 | * | 7/2003 | Wang ........................... 327/143 |
| 6,642,757 B2 | * | 11/2003 | Ikehashi et al. ............. 327/143 |
| 7,135,898 B2 | * | 11/2006 | Tseng et al. ................. 327/143 |

* cited by examiner

*Primary Examiner*—Kenneth B. Wells
*Assistant Examiner*—An T. Luu
(74) *Attorney, Agent, or Firm*—Schneck & Schneck; Thomas Schneck

(57) ABSTRACT

A power down reset circuit for asserting a signal when a first $V_{DD}$ voltage falls below a voltage threshold. The circuit has at least one diode coupled to the first $V_{DD}$ voltage. The at least one diode is configured to produce a second voltage. At least one capacitor is coupled to the at least one diode to maintain the second voltage. A voltage detector asserts a signal when the first $V_{DD}$ voltage drops below a threshold level. The voltage detector is powered by the second voltage and is coupled to the at least one diode.

9 Claims, 6 Drawing Sheets

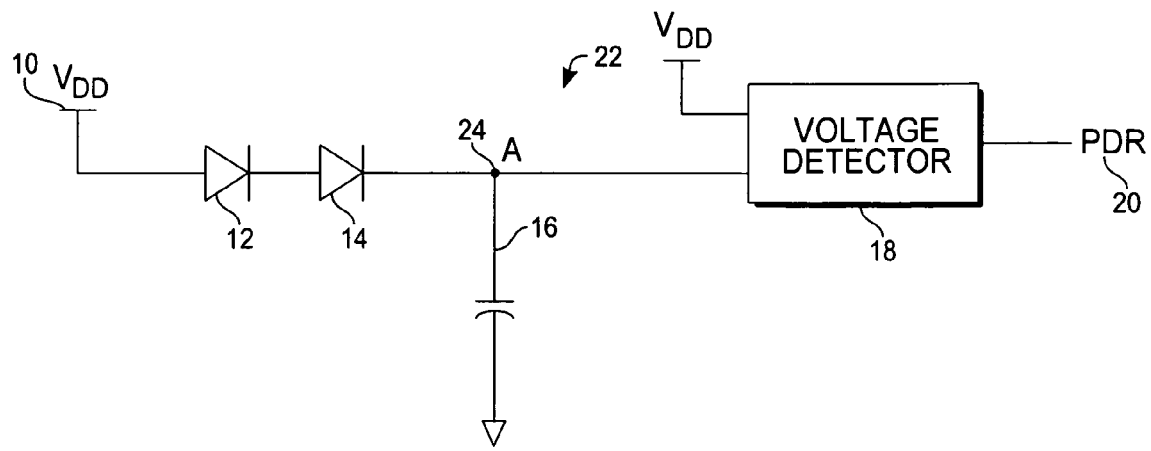
*Fig._1*
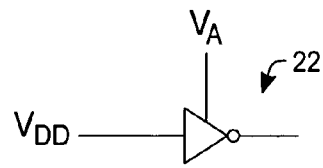
*Fig._2a*
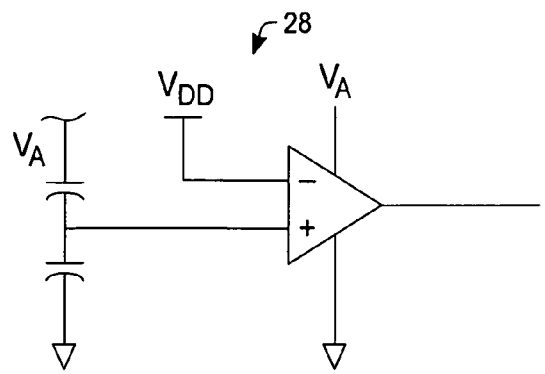
*Fig._2b*

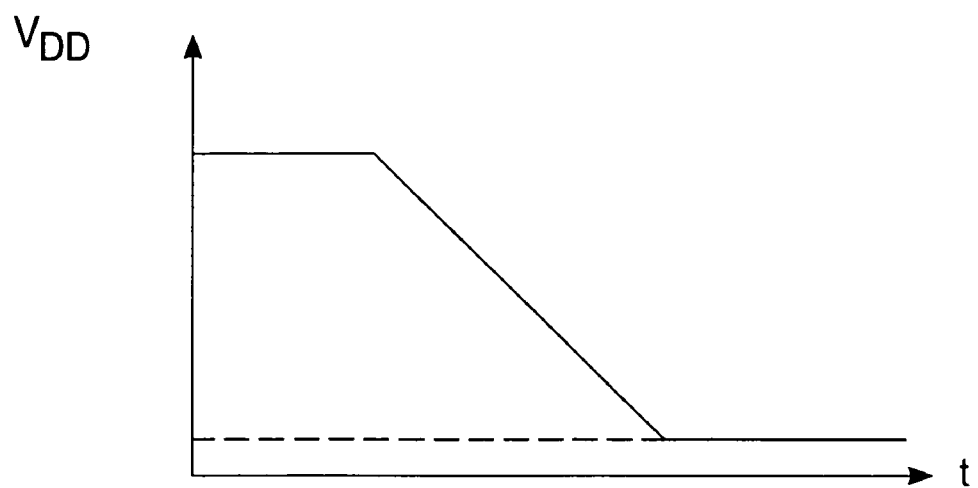
Fig._3a
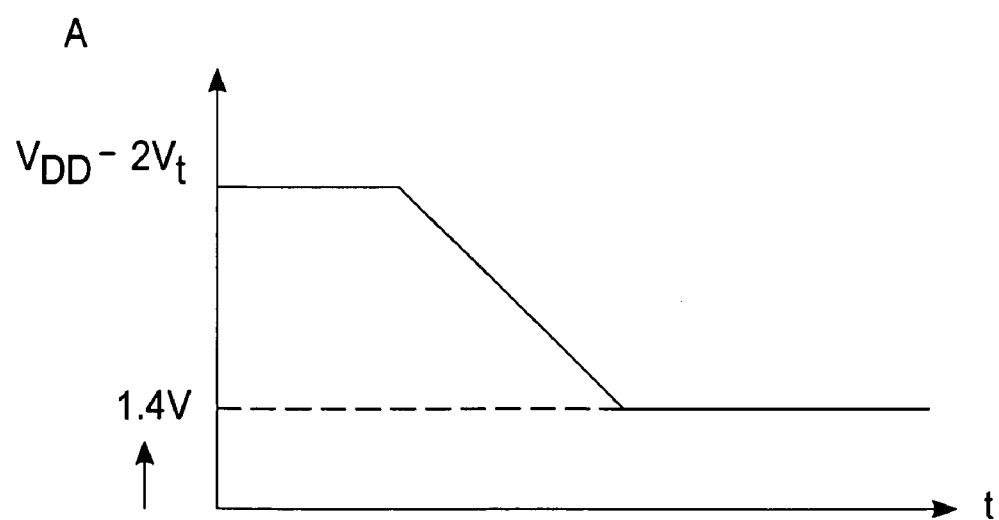
Fig._3b

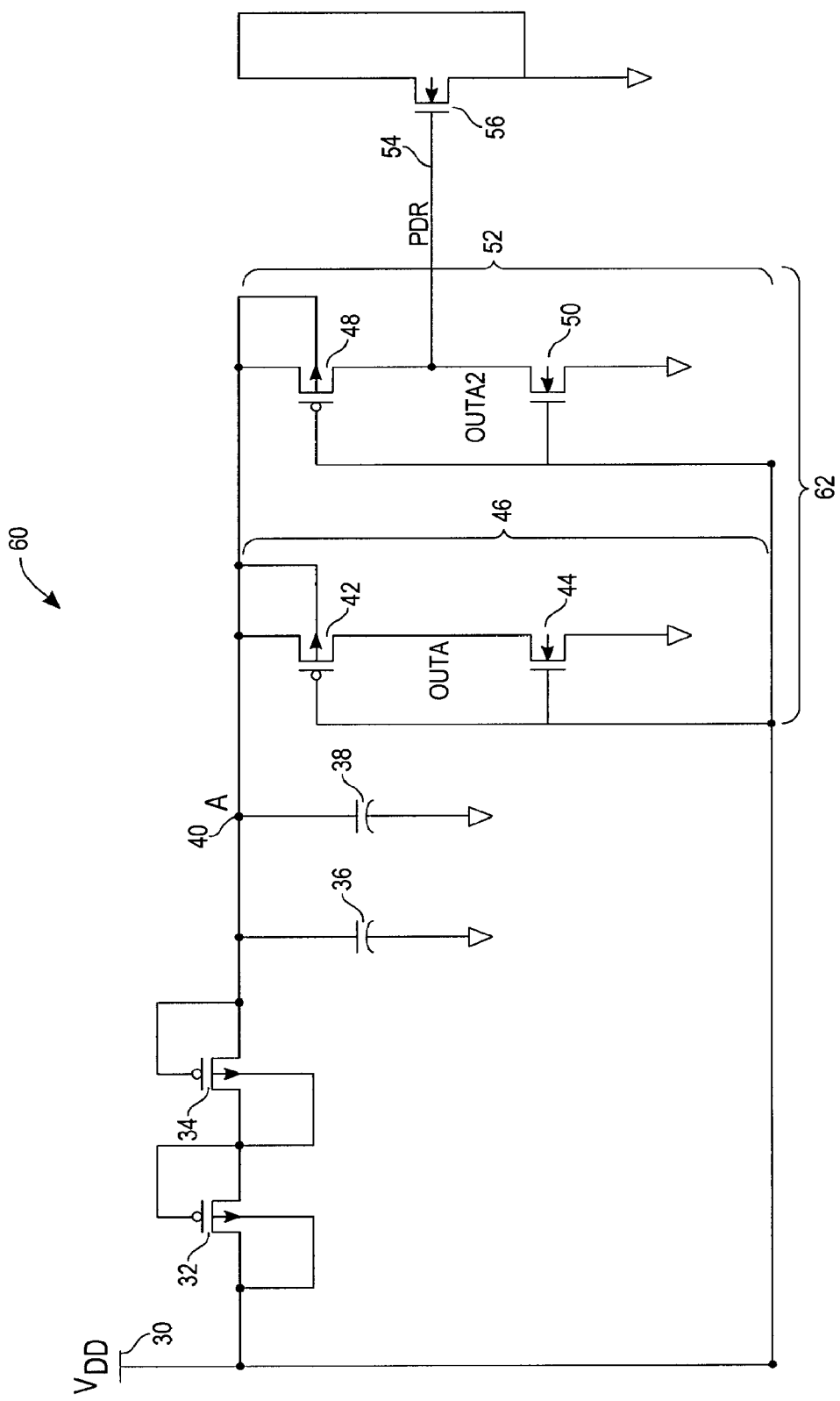
Fig._4

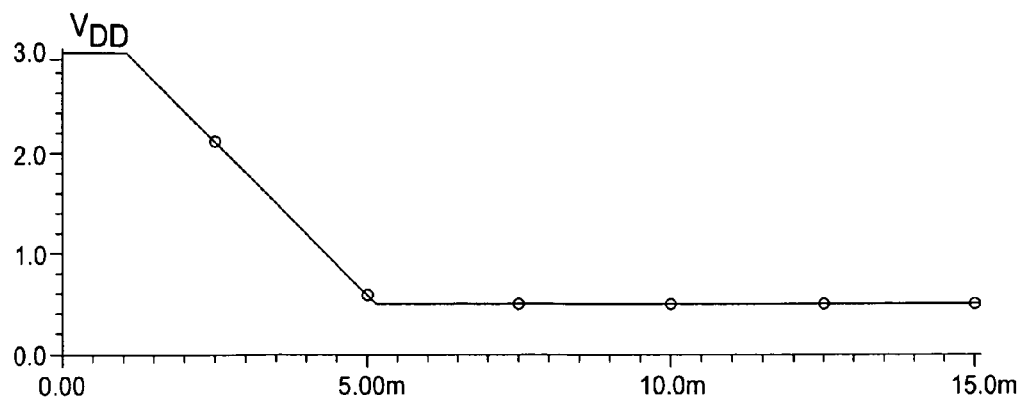
Fig._5a
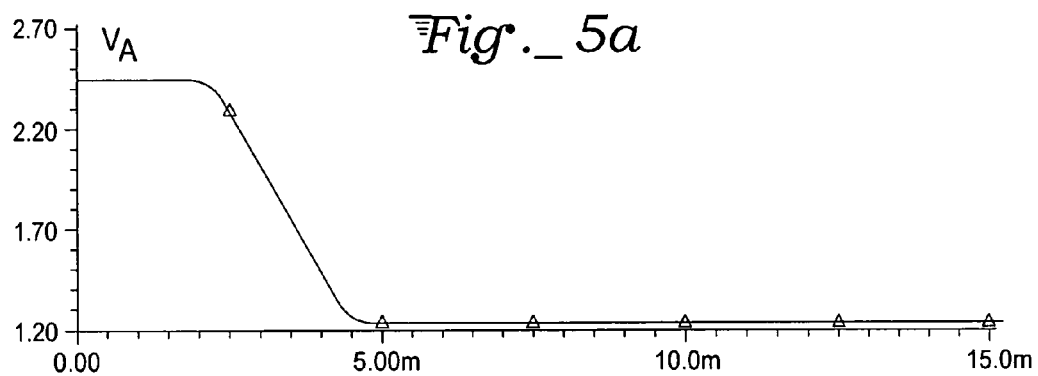
Fig._5b
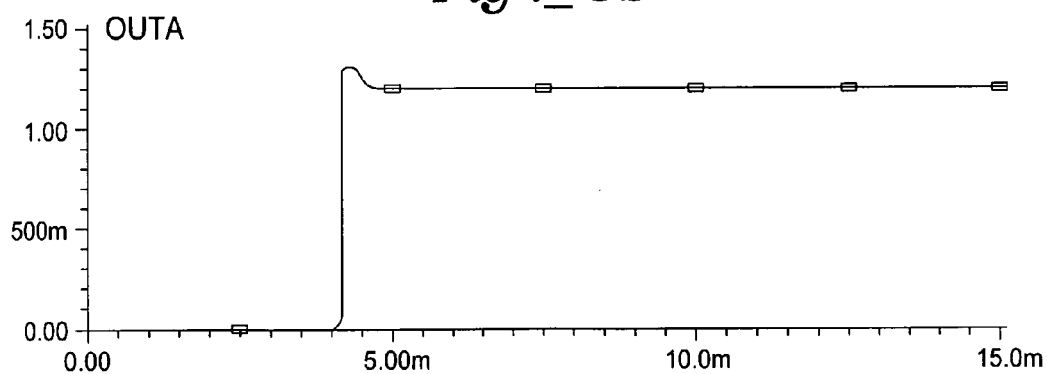
Fig._5c
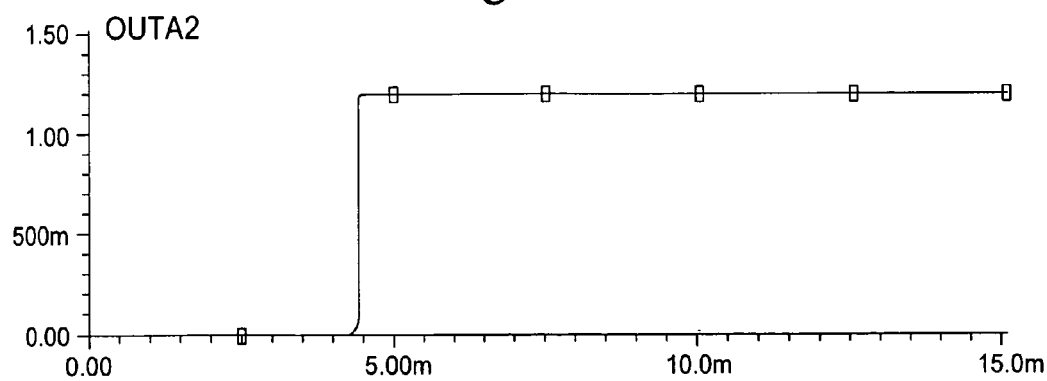
Fig._5d

POWER DOWN DETECTION CIRCUIT

TECHNICAL FIELD

This invention concerns circuits for detecting a power down condition.

BACKGROUND ART

A power supply voltage is required to be above a certain threshold voltage to effectively operate an associated electronic circuit. When the power supply voltage falls below this threshold, for instance, after a power down condition such as removal or interruption of a power supply, a power down reset (PDR") signal is asserted. The reset signal will hold the associated circuit in a reset state until the power supply voltage returns to a voltage level above a certain threshold voltage for effective circuit operation. If the-circuit is not in the reset state when the power supply voltage is below the operating threshold, the circuit may not operate properly.

Power down detection circuits may be used in different applications, including but not limited to cell phones and hard disk drives.

Much of the prior art focuses on power-up reset signals, where a reset signal is asserted when a power up condition is detected. In addition, the prior art relies on $V_{DD}$ to supply a voltage detector. This approach has come drawbacks, since it may be desirable to set different trip points which cannot be done if $V_{DD}$ supplies the voltage detector.

Therefore, it is desirable to have an improved circuit which will accurately detect a power down condition.

SUMMARY

In one embodiment of the invention, a circuit has at least one diode coupled in series to a first voltage. The at least one diode is configured to produce a second voltage. At least one capacitor is coupled to the at least one diode. The at least one capacitor is configured to maintain the second voltage. A voltage detector is configured to assert a signal when the first voltage drops below a threshold level. The voltage detector is configured to be powered by the second voltage and is coupled to the at least one diode.

In another embodiment, a circuit has means for receiving a first voltage and producing a second voltage. The means for receiving a first voltage and producing a second voltage is coupled to means for maintaining the second voltage. A means for detecting the first voltage is configured to be powered by the means for maintaining the second voltage. The means for detecting the first voltage is configured to assert a signal when the first voltage drops below a threshold level.

BRIEF DESCRIPTION OF THE DRAWINGS

FIG. 1 is a block diagram of a power down reset circuit in an exemplary embodiment of the invention.

FIG. 2a is a block diagram of an inverter employed as a voltage detector in an exemplary embodiment of the invention.

FIG. 2b is a block diagram of an operational amplifier employed as a voltage detector in an exemplary embodiment of the invention.

FIG. 3a is a graph of a first voltage during a period beginning before and ending after a power down condition in an exemplary embodiment of the invention.

FIG. 3b is a graph of a second voltage during a period beginning before and ending after a power down condition in an exemplary embodiment of the invention.

FIG. 4 is a diagram of a power down reset circuit in an exemplary embodiment of the invention.

FIG. 5a is a graph of a first voltage during a period beginning before and ending after a power down condition in an exemplary embodiment of the invention.

FIG. 5b is a graph of a second voltage during a period beginning before and ending after a power down condition in an exemplary embodiment of the invention.

FIG. 5c is a graph of third voltage during a period beginning before and ending after a power down condition in an exemplary embodiment of the invention.

FIG. 5d is a graph of a fourth voltage during a period beginning before and ending after a power down condition in an exemplary embodiment of the invention.

DETAILED DESCRIPTION

Figure 6:
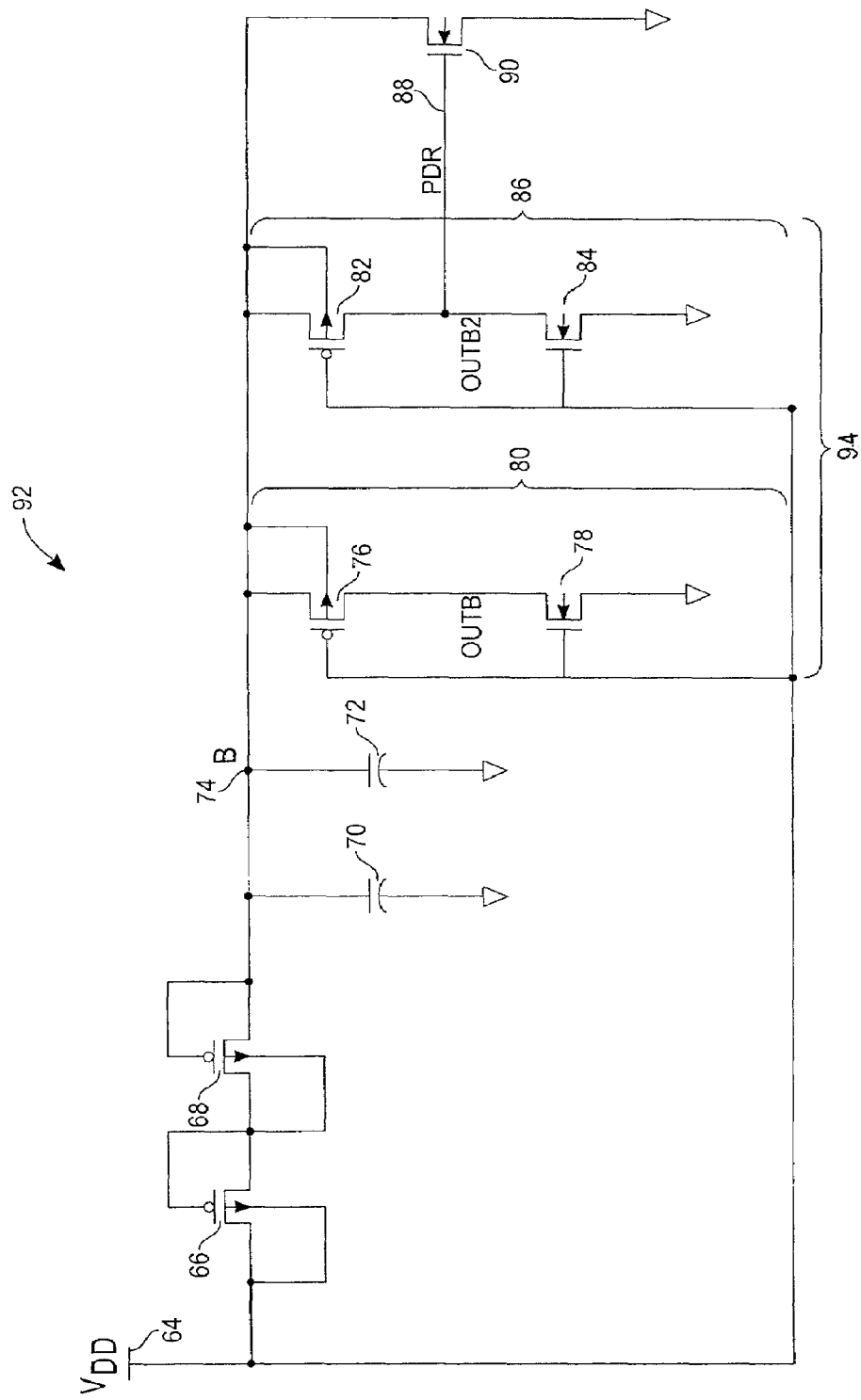
FIG. 6 is a diagram of a power down reset circuit in an exemplary embodiment of the invention.

FIG. 1 shows an exemplary embodiment of a power down reset circuit 22. Two diodes 12, 14 are coupled to $V_{DD}$ 10 ($V_{DD}$ may be any suitable voltage source, such as a rail). A capacitor 16 is coupled to a diode 14. The diodes 12, 14 reduce the voltage a specified amount via a forward voltage drop, provided the voltage is at least at a predetermined threshold level (this is discussed in greater detail, below). (In other embodiments, only one diode may be employed.) The capacitor 16 stores sufficient charge to maintain a minimum voltage $V_A$ (which is electrically isolated from $V_{DD}$) at node A 24 (the voltage at node A may exceed the minimum voltage $V_A$ but, for purposes of operation of the circuit, will not drop below the minimum voltage $V_A$). This minimum voltage $V_A$ is sufficient to power a voltage detector 18 coupled to the capacitor 16. The voltage detector 18 outputs a power down reset ("PDR") signal on the PDR line 20. When $V_{DD}$ falls below a threshold level, indicating a power down condition, the voltage detector 18 detects the drop of $V_{DD}$ and outputs a PDR signal on the PDR line 20.

With reference to FIG. 2a, the voltage detector in one exemplary embodiment may be one or more inverters 26. In FIG. 2b, the voltage detector in another embodiment may be an operational amplifier 28.

As noted above, the power down reset circuit 22 produces a PDR signal when the voltage $V_{DD}$ falls below a certain threshold, indicating a power down condition. The graph of $V_{DD}$ voltage vs. time in FIG. 3a shows such a power down condition during a period of time where after removal or interruption of power $V_{DD}$ falls from a stable operating voltage to a value approaching 0 volts. FIG. 3b is also a graph of voltage vs. time showing the effect of a power down condition on voltage A. $V_A$, like $V_{DD}$, also drops at removal or interruption of power, but does not drop below a $V_A$ minimum value (here, 1.4 V) due to the capacitor storing sufficient charge to maintain a minimum $V_A$. This minimum $V_A$ provides sufficient voltage to sustain the voltage detection elements of the power down reset circuit.

An exemplary embodiment of the power down reset circuit 60 is shown in FIG. 4. A first diode 32 receives power from a voltage source $V_{DD}$ 30. A second diode 34 is coupled in series to the first diode 32. In this embodiment, the diodes 32, 34 are PMOS transistors configured as diodes in series. These diodes 32, 34 produce a voltage A via a forward voltage drop. ($V_{DD}-2V_{diode}=V_A$) Capacitors 36, 38, which are coupled to the second diode 34 as well as being coupled between $V_A$ and ground, store charge such that the voltage at node A 40, for purposes of operation of the circuit, does not fall below a minimum voltage $V_A$ (as noted above, $V_A$ may exceed the minimum but will not fall below this minimum). A voltage detector 62 is coupled to the capacitors 36, 38. In this embodiment, the voltage detector 62 is comprised of two CMOS inverters 46, 52. Each inverter 46, 52 consists of an NMOS transistor 44, 50 coupled to a PMOS transistor 42, 48. The gates of each of the NMOS transistors 44, 50 and PMOS transistors 42, 48 are each coupled to $V_{DD}$. The source of each of the PMOS transistors 42, 48 is coupled to node A 40. The drain of the NMOS transistor 44, 50 in each inverter 46, 52 is coupled to the drain of the PMOS transistor 42, 48 in the same inverter 46, 52. The PDR line 54 carries the output signal from the second inverter 42 to a gate of a third NMOS transistor 56, which in this embodiment is configured as a capacitor.

In other embodiments, the two inverters may have different characteristics. These different characteristics may include one inverter turning on or off faster than the other inverter, different trigger points, etc.

The operation of the power down reset circuit 60 during a power down condition will now be described. In FIG. 5a, a graph of $V_{DD}$ voltage vs. time shows $V_{DD}$ at a stable operating voltage (in this embodiment, 3 V, though different voltages may be used in other embodiments) at time 0. However, the power is interrupted or removed shortly after time 0, at which time $V_{DD}$ declines, eventually reaching a voltage near 0 about 5 ms after the power interruption or removal (the decay times and decay slopes may differ in other embodiments). In FIG. 5b, voltage A also declines after interruption or removal of power; however, voltage A never drops below a minimum voltage (here, 1.2 V, though other minimum voltages may be employed in other embodiments). Referring again to FIG. 4, the fact that voltage A never drops below a minimum voltage is due to the capacitors 36, 40 storing charge. This minimum voltage A is used to power the voltage detector 62, as described below.

The voltage detector 62 detects when $V_{DD}$ has fallen below a threshold level, for instance, during a power down condition. When $V_{DD}$ 30 is "high," for instance, at a stable operating voltage, the NMOS transistors 44, 50 in the inverters 46, 52 are on, the PMOS transistors 42, 48 in the same inverters 46, 52 are off, and each of the inverters' 46, 52 output (OUTA and OUTA2) is low. However, when $V_{DD}$ 30 is low, i.e., drops below a threshold voltage, the NMOS transistors 44, 50 in the inverters 46, 52 are turned off, the PMOS transistors 42, 48 in the same inverters 46, 52 are turned on, and each of the inverters' 46, 52 output is high. This condition generates a PDR signal on linen 20 indicating a power down condition. FIG. 5c shows that when voltage A is approaching its minimum voltage, OUTA (the output of inverter 46) is high. FIG. 5d shows that when voltage A reaches its minimum voltage, OUTA2 (the output of inverter 52) is high. This output is the PDR signal indicating a power down condition. Referring again to FIG. 4, this signal continues to be asserted, provided $V_{DD}$ is below a threshold voltage, by NMOS transistor 56, which acts as a capacitor.

Another embodiment of a power down reset circuit 92 is shown in FIG. 6. A first diode 66 receives power from a voltage source $V_{DD}$ 64. A second diode 68 is coupled to the first diode 66. In this embodiment, the diodes 66, 68 are PMOS transistors configured as diodes in series. These diodes 66, 68 produce a voltage B ($V_{DD}-2V_{diode}=V_B$) via a forward voltage drop. Capacitors 70, 72, which are coupled to the second diode 68 as well as being coupled between $V_B$ and ground, store charge such that, for purposes of operation of the circuit, the voltage at node B 74 never falls below a minimum voltage $V_B$ (similar to the discussion about voltage A, above, $V_B$ may exceed the minimum but will not fall below this minimum). A voltage detector 94 is coupled to the capacitors 70, 72. In this embodiment, the voltage detector 94 is comprised of two inverters 80, 86. Each inverter 80, 86 consists of an NMOS transistor 78, 84 coupled to a PMOS transistor 76, 82. The gates of each of the NMOS transistors 78, 84 and PMOS transistors 76, 82 are each coupled to $V_{DD}$. The source of each of the PMOS transistors 76, 82 is coupled to node B 74. The drain of the NMOS transistor 78, 84 in each inverter 80, 86 is coupled to the drain of the PMOS transistor 76, 82 in the same inverter 80, 86. The PDR line 88 carries the output signal from the second inverter 86 to a gate of a third NMOS transistor 90, which in this embodiment is turned on to attenuate the PDR signal.

Figure 7A:
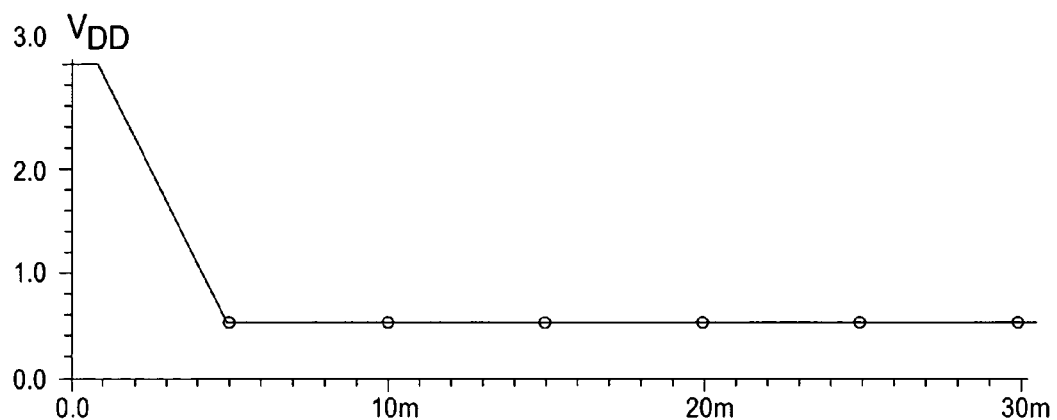
FIG. 7a is a graph of a first voltage during a period beginning before and ending after a power down condition in an exemplary embodiment of the invention.
Figure 7B:
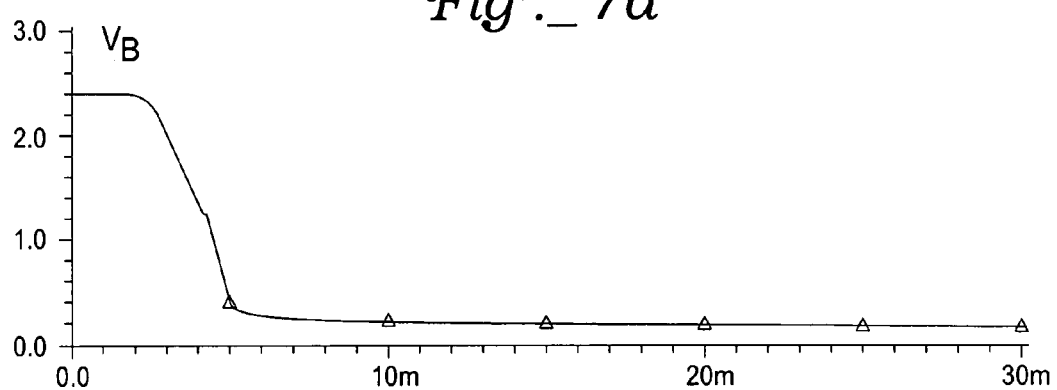
FIG. 7b is a graph of a second voltage during a period beginning before and ending after a power down condition in an exemplary embodiment of the invention.

The operation of the power down reset circuit 92 during a power down condition will now be described. In FIG. 7a, a graph of $V_{DD}$ voltage vs. time shows $V_{DD}$ at a stable operating voltage (in this embodiment, 3 V, though different voltages may be used in other embodiments) at time 0. However, the power is interrupted or removed shortly after time 0, at which time $V_{DD}$ declines, eventually reaching a voltage near 0 about 5 ms after the power interruption or removal (the decay times and decay slopes may differ in other embodiments). In FIG. 7b, voltage B also declines after interruption or removal of power; however, voltage B never drops below a minimum voltage (here, 0.2 V, though other minimum voltages may be employed in other embodiments). Referring again to FIG. 6, the fact that voltage B never drops below a minimum voltage is due to the capacitors 70, 72 storing charge. This minimum voltage B is used to power the voltage detector 94, as described below.

Figure 7C:
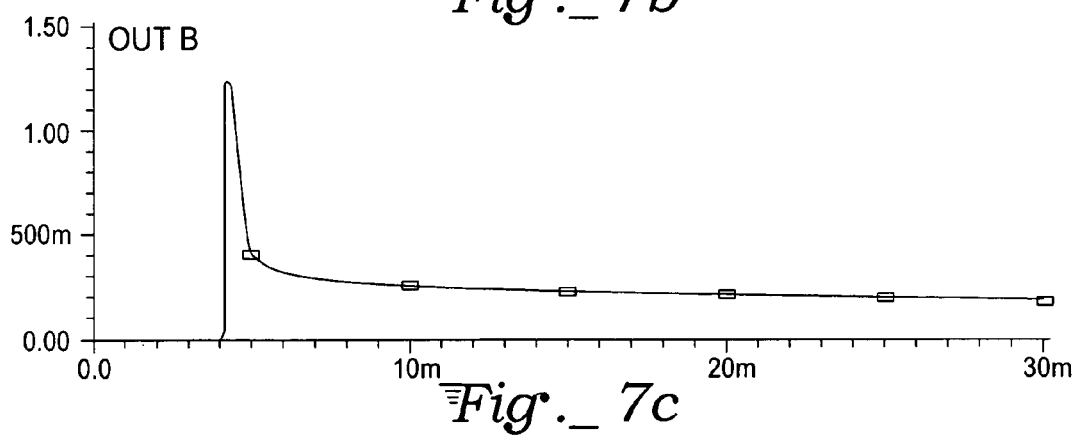
FIG. 7c is a graph of third voltage during a period beginning before and ending after a power down condition in an exemplary embodiment of the invention.
Figure 7D:
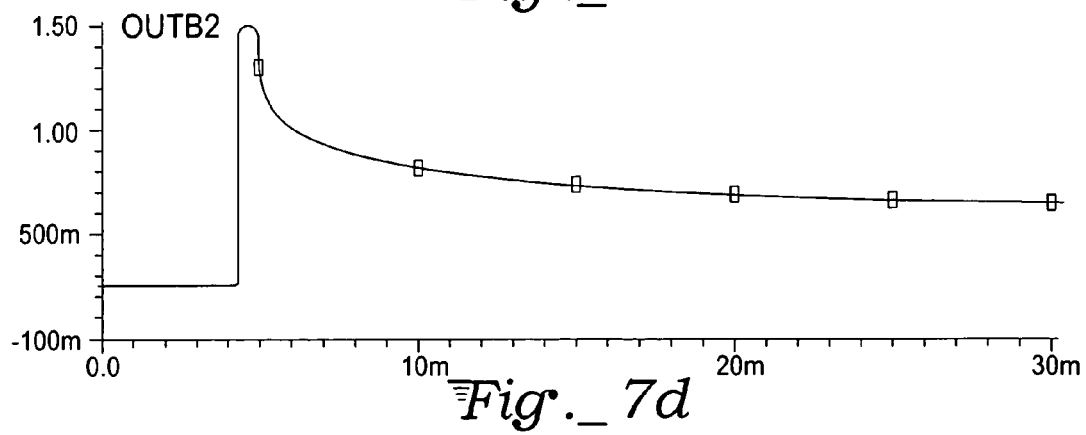
FIG. 7d is a graph of a fourth voltage during a period beginning before and ending after a power down condition in an exemplary embodiment of the invention.

The voltage detector 94 detects when $V_{DD}$ has fallen below a threshold level, for instance, during a power down condition. When $V_{DD}$ 64 is "high," for instance, at a stable operating voltage, the NMOS transistors 78, 84 in the inverters 80, 86 are turned on, the PMOS transistors 76, 82 in the same inverters 80, 86 are turned off, and each of the inverters' 76, 82 output (OUTB and OUTB2) is low. However, when $V_{DD}$ 64 is low, the NMOS transistors 78, 84 in the inverters 80, 86 are turned off, the PMOS transistors 76, 82 in the same inverters 80, 86 are turned on, and each of the inverters' 80, 86 output is high. This condition generates a PDR signal indicating a power down condition. FIG. 7c shows that when voltage B is approaching its minimum voltage, OUTB (the output of inverter 78) is high. FIG. 7d shows that when voltage B reaches its minimum voltage, OUTB2 (the output of inverter 86) is high. This output is the PDR signal indicating a power down condition. As seen in FIG. 7d, this signal is attenuated due to the NMOS transistor 90 in FIG. 6. The gate of the NMOS transistor 90 is coupled to the output from the voltage detector 94. A high PDR signal turns on the NMOS transistor 90, causing the output signal to be attenuated.

The size of the various devices in the exemplary embodiments of the PDR circuit described above may be varied so that the trigger, or reset, level may be set at different levels in other embodiments. For instance, $V_{DD}$, $V_A$, $V_B$, the capacitances, and threshold levels may be altered in different embodiments. In addition, different numbers of series-connected diodes, parallel capacitors, etc. may be employed in different embodiments. Also, as noted above, in one embodiment, the voltage detector is an operational amplifier. While the preceding description has described specific embodiments, it will be evident to a skilled artisan that various changes and modifications can be made to these embodiments. The specification and drawings, therefore, are to be regarded in an illustrative rather than a restrictive sense.

What is claimed is:

1. A circuit comprising:
   a) at least one diode coupled in series to a first voltage, the at least one diode configured to produce a second voltage;
   b) at least one capacitor coupled to the diode, the at least one capacitor configured to maintain the second voltage;
   c) a voltage detector configured to assert a signal when the first voltage drops below a threshold level, the voltage detector configured to be powered by the second voltage, the voltage detector coupled to the at least one diode; and
   d) an NMOS transistor, wherein a gate of the NMOS transistor is coupled to an output of the voltage detector, a drain of the NMOS transistor is coupled to the capacitor, and the NMOS transistor is configured to attenuate the signal.

2. The circuit of claim 1 wherein the voltage detector is at least one inverter.

3. The circuit of claim 1 wherein the voltage detector is an operational amplifier.

4. The circuit of claim 1 further comprising an NMOS transistor, a gate of the NMOS transistor coupled to an output of the voltage detector, the NMOS transistor configured to maintain the signal when the first voltage drops below a threshold level.

5. A circuit comprising:
   a) means for receiving a first voltage and producing a second voltage that is less than the first voltage;
   b) means for maintaining the second voltage, the means for maintaining the second voltage coupled to the means for receiving a first voltage;
   c) means for detecting the first voltage, the means for detecting the first voltage coupled to the means for receiving a first voltage, the means for detecting the first voltage configured to be powered by the means for maintaining the second voltage, the means for detecting a first voltage configured to assert a signal when the first voltage drops below a threshold level; and
   d) means, using a shunt transistor, for attenuating the signal while the first voltage is below the threshold level, the means for attenuating the signal while the first voltage is below the threshold level coupled to the means for detecting the first voltage.

6. The circuit of claim 5 further comprising means for continuing to assert the signal while the first voltage is below the threshold level, the means for continuing to assert the signal coupled to the means for detecting the first voltage.

7. A method comprising:
   receiving a first voltage;
   deriving a second voltage based on the first voltage;
   maintaining the second voltage;
   detecting whether the first voltage has dropped below a threshold level, the voltage detector powered by the second voltage;
   asserting a signal when the first voltage has dropped below the threshold level; and
   attenuating the signal with a shunt NMOS transistor while the first voltage is below the threshold level.

8. The method of claim 7 further comprising continuing to assert the signal when the first voltage is below the threshold level.

9. The method of claim 7 wherein maintaining the second voltage includes maintaining the second voltage above a predetermined voltage.

* * * * *